United States Patent
Boenapalli et al.

(10) Patent No.: US 11,048,438 B2
(45) Date of Patent: Jun. 29, 2021

(54) DATA RATE SHIFTING BASED ON TEMPERATURE

(71) Applicant: QUALCOMM Incorporated, San Diego, CA (US)

(72) Inventors: Madhu Yashwanth Boenapalli, Hyderabad (IN); Sai Praneeth Sreeram, Anantapur (IN); Surendra Paravada, Hyderabad (IN); Venu Madhav Mokkapati, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 16/400,468

(22) Filed: May 1, 2019

(65) Prior Publication Data
US 2020/0348884 A1    Nov. 5, 2020

(51) Int. Cl.
*G06F 3/00* (2006.01)
*G06F 3/06* (2006.01)

(52) U.S. Cl.
CPC .......... *G06F 3/0659* (2013.01); *G06F 3/0613* (2013.01); *G06F 3/0653* (2013.01); *G06F 3/0679* (2013.01)

(58) Field of Classification Search
None
See application file for complete search history.

(56) References Cited

U.S. PATENT DOCUMENTS

2013/0173944 A1* 7/2013 Kohler ................... G06F 1/324
                                                              713/324

* cited by examiner

*Primary Examiner* — Midys Rojas
(74) *Attorney, Agent, or Firm* — Patterson & Sheridan, L.L.P

(57) ABSTRACT

In some aspects, the present disclosure provides a method for managing data communication rates of a memory device. The method includes receiving an input/output (I/O) operation to be performed by the memory device, detecting a temperature of the memory device, and determining whether the detected temperature satisfies a threshold condition. The threshold condition is satisfied if the detected temperature is above a first temperature threshold or below a second temperature threshold. If the threshold condition is satisfied, selecting a gear from a plurality of gears based on a ranking of the plurality of gears at the detected temperature, wherein each gear of the plurality of gears correspond to a respective one of a plurality of data rates used by the memory device for performing I/O operations, and serving, to the memory device, the I/O operation with an indication to perform the I/O operation using the selected gear.

20 Claims, 6 Drawing Sheets

DATA RATE SHIFTING BASED ON TEMPERATURE

BACKGROUND

Field of the Disclosure

The teachings of the present disclosure relate generally to memory operations, and more particularly, to techniques for temperature-dependent data rate shifting for execution of memory operations.

Description of the Related Art

Flash memory (e.g., non-volatile computer storage medium) is a type of memory that can store and hold data without a constant source of power. In contrast, data stored in volatile memory may be erased if power to the memory is lost. Flash memory is a type of memory that has become popular in many applications, including automobiles.

Employing flash memory devices in automobiles for storing and reading vehicular parameters enhances cost-effective large-scale production. For example, a common flash memory device can be installed in multiple automobile types and programmed according to a particular type after installation. Flash memories feature a high storage density and permit blockwise clearing, whereby a rapid and simple programming is ensured. However, making use of such memories at high temperatures may result in functional failure of the flash memory device. For example, electron mobility—which increases exponentially at extreme temperatures—can reduce data reliability in read and write operations.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the disclosure relate to a method for managing data communication rates of a memory device. The method includes, executing a first memory test configured to determine performance of the memory device at a detected temperature and at each gear of a plurality of gears, wherein each gear corresponds to a respective one of a plurality of data rates used by the memory device for performing I/O operations. The method also includes, determining a first rank of one or more of the plurality of gears based on memory device performance of the first memory test, receiving an input/output (I/O) operation to be executed by the memory device, and detecting the temperature of the memory device. The method also includes, determining whether the detected temperature satisfies a threshold condition, wherein the threshold condition is satisfied if the detected temperature is above a first temperature threshold or below a second temperature threshold. The method also includes, if the threshold condition is satisfied, selecting a gear from the plurality of gears based on the first rank, and serving, to the memory device, the I/O operation with an indication to execute the I/O operation using the selected gear.

Certain aspects of the disclosure relate to a memory controller configured for managing data communication rates of a memory device. The memory controller includes a digital memory, and a processor communicatively coupled to the memory, wherein the processor is configured to execute a first memory test configured to determine performance of the memory device at a detected temperature and at each gear of a plurality of gears, wherein each gear corresponds to a respective one of a plurality of data rates used by the memory device for performing I/O operations. The processor is also configured to determine a first rank of one or more of the plurality of gears based on memory device performance of the first memory test, receive an input/output (I/O) operation to be executed by the memory device, and detect the temperature of the memory device. The processor is also configured to determine whether the detected temperature satisfies a threshold condition, wherein the threshold condition is satisfied if the detected temperature is above a first temperature threshold or below a second temperature threshold, and if the threshold condition is satisfied, select a gear from the plurality of gears based on the first rank. The processor is also configured to serve, to the memory device, the I/O operation with an indication to execute the I/O operation using the selected gear.

Certain aspects of the disclosure relate to an apparatus. The apparatus includes means for executing a first memory test configured to determine performance of a memory device at a detected temperature and at each gear of a plurality of gears, wherein each gear corresponds to a respective one of a plurality of data rates used by the memory device for performing I/O operations. The apparatus also includes means for determining a first rank of one or more of the plurality of gears based on memory device performance of the first memory test, means for receiving an input/output (I/O) operation to be executed by the memory device, and means for detecting the temperature of the memory device. The apparatus also includes means for determining whether the detected temperature satisfies a threshold condition, wherein the threshold condition is satisfied if the detected temperature is above a first temperature threshold or below a second temperature threshold, means for selecting a gear from the plurality of gears based on the first rank if the threshold condition is satisfied, and means for serving, to the memory device, the I/O operation with an indication to execute the I/O operation using the selected gear.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
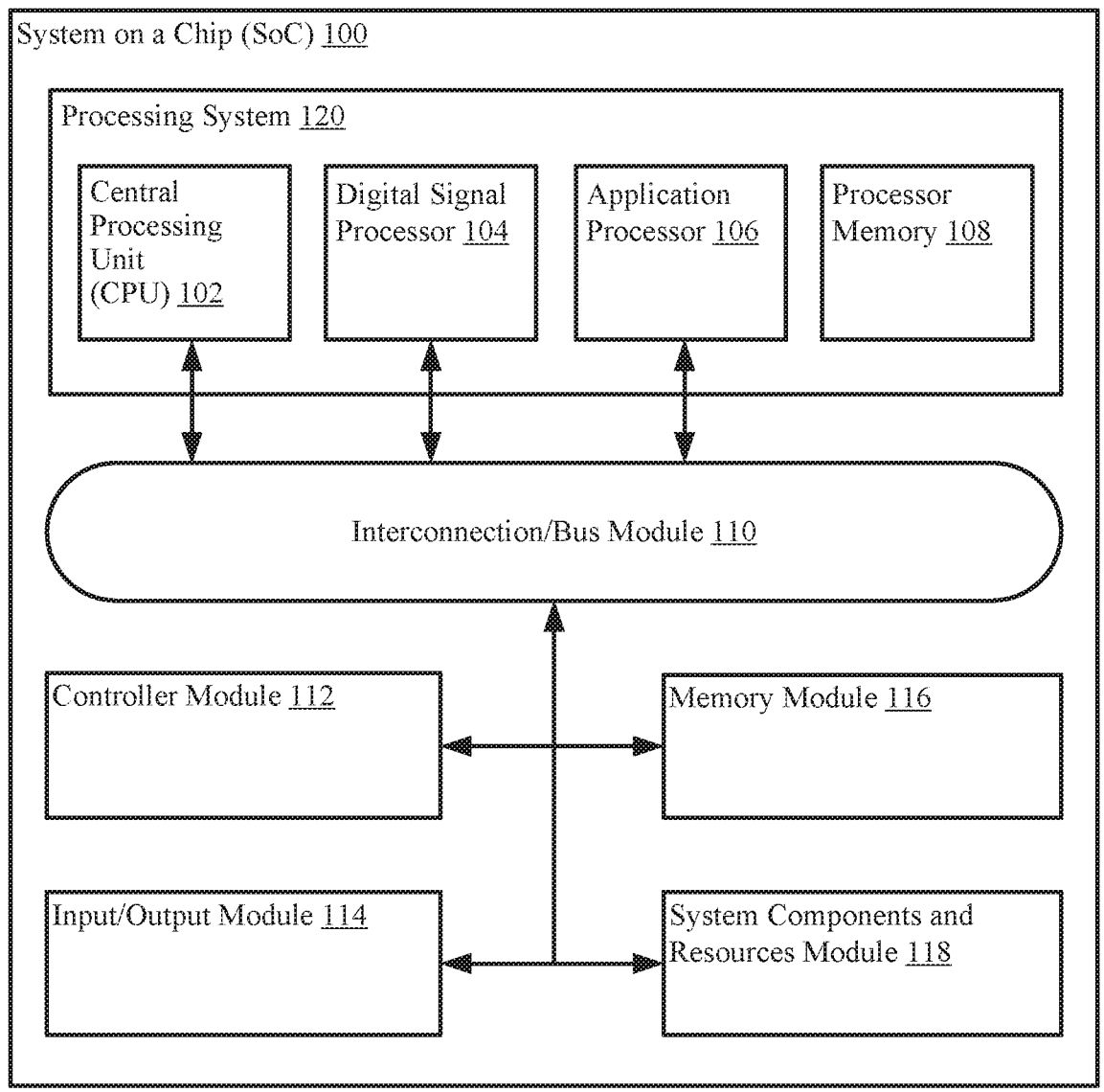
FIG. 1 is a block diagram illustrating an exemplary system-on-chip (SoC) integrated circuit in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with various other embodiments discussed herein.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors, modem processors, video processors, etc.), memory blocks (e.g., ROM, RAM, Flash, etc.), and resources (e.g., timers, voltage regulators, oscillators, etc. any or all of which may be included in one or more cores.

A number of different types of memories and memory technologies are available or contemplated in the future, all of which are suitable for use with the various aspects of the present disclosure. Such memory technologies/types include phase change memory (PRAM), dynamic random-access memory (DRAM), static random-access memory (SRAM), non-volatile random-access memory (NVRAM), flash memory (e.g., embedded multimedia card (eMMC) flash, flash erasable programmable read only memory (EEPROM)), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies include, for example, elements suitable for storing instructions, programs, control signals, and/or data for use in or by a computer or other digital electronic device. Any references to terminology and/or technical details related to an individual type of memory, interface, standard or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 is a block diagram illustrating an exemplary system-on-chip (SoC) 100 suitable for implementing various aspects of the present disclosure. The SoC 100 includes a processing system 120 that includes a plurality of heterogeneous processors such as a central processing unit (CPU) 102, a digital signal processor 104, an application processor 106, and a processor memory 108. The processing system 120 may include one or more cores, and each processor/core may perform operations independent of the other processors/cores. The processors 102, 104, and 106 may be organized in close proximity to one another (e.g., on a single substrate, die, integrated chip, etc.) so that they may operate at a much higher frequency/clock-rate than would be possible if the signals were to travel off-chip. The proximity of the cores may also allow for the sharing of on-chip memory and resources (e.g., voltage rail), as well as for more coordinated cooperation between cores.

The processing system 120 is interconnected with one or more controller module(s) 112, input/output (I/O) module(s) 114, memory module(s) 116, and system component and resources module(s) 118 via a bus module 110 which may include an array of reconfigurable logic gates and/or implement bus architecture (e.g., CoreConnect, AMBA, etc.). Bus module 110 communications may be provided by advanced interconnects, such as high performance networks on chip (NoCs). The interconnection/bus module 110 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the bus module 110 may implement an arbitration scheme to prevent multiple master components from attempting to drive the bus simultaneously.

The controller module 112 may be a specialized hardware module configured to manage the flow of data to and from the memory module 116, the processor memory 108, or a memory device located off-chip (e.g., a flash memory device). The controller module 112 may comprise one or more processors configured to perform operations disclosed herein. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure.

The I/O module 114 is configured for communicating with resources external to the SoC. For example, the I/O module 114 includes an input/output interface (e.g., a bus architecture or interconnect) or a hardware design for performing specific functions (e.g., a memory, a wireless device, and a digital signal processor). In some examples, the I/O module includes circuitry to interface with peripheral devices, such as a memory device located off-chip.

The memory module 116 is a computer-readable storage medium implemented in the SoC 100, The memory module 116 may provide non-volatile storage for one or more of the processing system 120, controller module 112, I/O module 114, or the system components and resources module 118. The memory module 116 may include a non-volatile memory controller and a cache memory to provide temporary storage of information to enhance processing speed of the SoC 100.

The SoC 100 may include a system components and resources module 118 for managing sensor data, analog-to-digital conversions, wireless data transmissions, and for performing other specialized operations (e.g., supporting interoperability between different devices). System components and resources module 118 may also include components such as voltage regulators, oscillators, phase-locked loops, peripheral bridges, data controllers, system controllers, access ports, timers, and other similar components used to support the processors and software clients running on the computing device. The system components and resources 118 may also include circuitry for interfacing with peripheral devices, such as cameras, electronic displays, wireless communication devices, external memory chips, etc.

Figure 2:
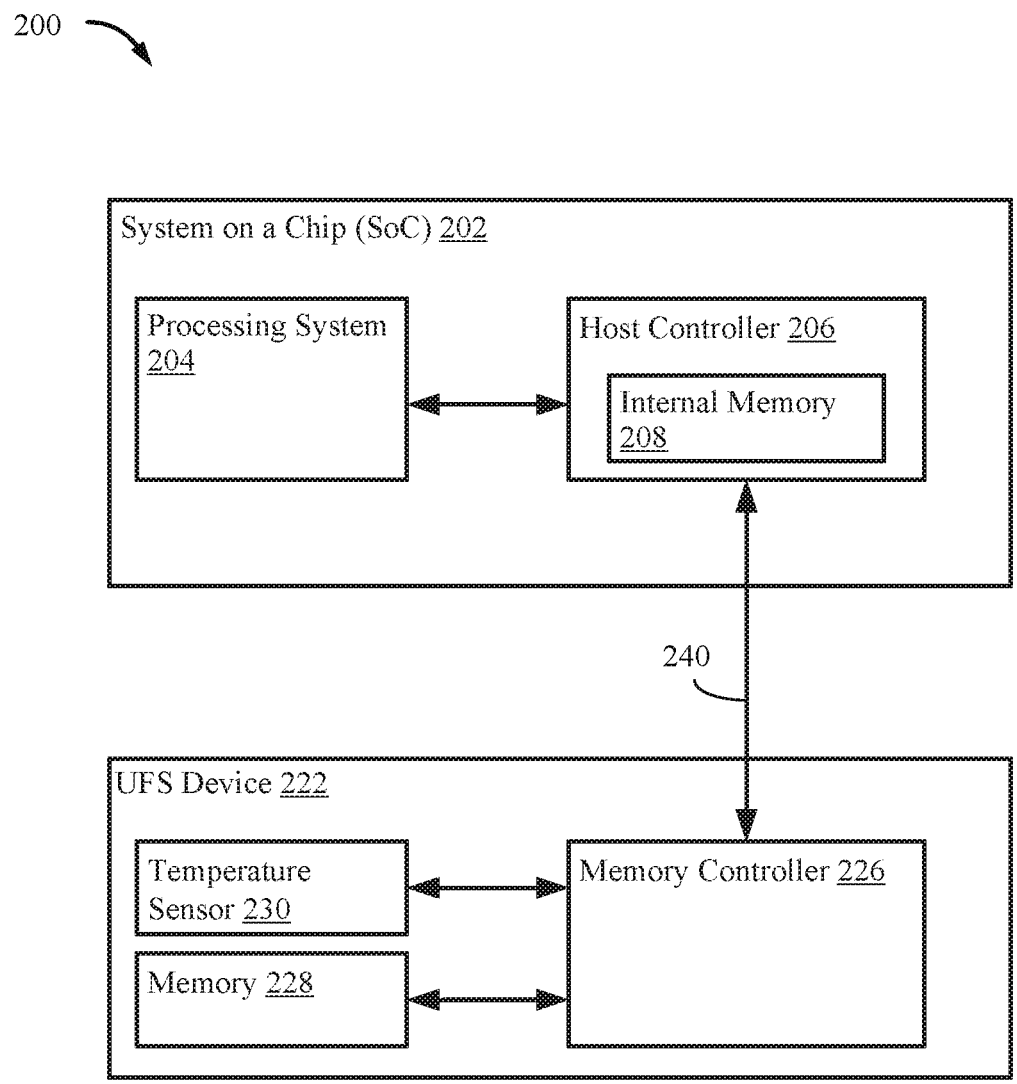
FIG. 2 is block diagram illustrating an exemplary system including an SoC circuit coupled with a universal flash storage (UFS) device in accordance with certain aspects of the present disclosure.

FIG. 2 is block diagram illustrating an exemplary memory system 200 including an SoC 202 with an off-chip universal flash storage (UFS) device 222 in accordance with certain aspects of the present disclosure. Of course, the off-chip UFS device configuration illustrated in FIG. 2 is not necessarily the only configuration that may be utilized between an SoC and a UFS device, and those of ordinary skill in the art will recognize that other configurations may be utilized in addition to those illustrated, such as an on-chip UFS device located on the SoC.

As shown in FIG. 2, the SoC 202 includes a processing system 204 (e.g., processing system 120 of FIG. 1) and a host controller 206 (e.g., controller module 112 of FIG. 1), The processing system 204 may execute commands that implement any suitable native file system layer, for example, an NTH or an ext3 type file system layer. These file system layers interface with the host controller 206 to access the UFS device 222 and implement file system-related data transfer and control operations.

The host controller 206 is communicatively coupled to a memory controller 226 of the UFS device 222. The host controller 206 is configured to cooperate with the memory controller 226 to exchange data and commands via an interface 240. In one embodiment, interface 240 is a high-speed serial interface having a plurality of lanes, with each lane configured for electrical transmission of data. In some examples, each lane is a unidirectional, single-signal, physical transmission channel. Accordingly each lane may have its own physical interface between the host controller 206 and the memory controller 226. The rate at which data is transmitted over the plurality of lanes is dependent on which gear of a plurality of gears is being used. In some examples, each gear corresponds to a different data rate. Table 1 below provides an example of a plurality of gears and corresponding data rates:

TABLE 1

| Data Rate Per Lane (Gbps) | Gear |
| --- | --- |
| 1.5 Gbps | HS-G1 (first gear) |
| 3 Gbps | HS-G2 (second gear) |
| 6 Gbps | HS-G3 (third gear) |
| 11.7 Gbps | HS-G4 (fourth gear) |

Commands from the host controller 206 to the memory controller 226 generally relate to operations in memory such as input/output (I/O) operations (e.g., read and write operations), although commands can also be directed to the memory controller 226 to assist in memory functions. Host controller 206 is configured to select the gear and number of lanes that the UFS device 222 uses for each I/O operation according to one or more parameters, including temperature of the UFS device 222. In one embodiment, the commands and signaling protocol are compatible with one or more standards, for example, with non-volatile memory express (NVMe) or the small computer system interface (SCSI) (in the case of commands) and peripheral component interconnect express (PCIe) or serial-attached SCSI/serial ATA (SAS/SATA) (in the case of signaling formats).

In addition to the memory controller 226, the UFS device 222 includes a memory 228 and a temperature sensor 230 communicatively coupled to the memory controller 226. The memory 228 generally includes an array of memory cells and control circuitry controlled by the memory controller 226. The memory 228 may include one or more subdivisions of memory cells for which subdivision-specific usage data should be tracked by the memory controller 226. In certain embodiments, memory 228 is structured as low latency nonvolatile memory such as flash memory.

The temperature sensor 230 includes one or more temperature sensors configured to measure the temperature of one or more aspects of the UFS device 222 (e.g., the package case temperature of the UFS device, the silicon temperature of the memory 228, etc.) and provide temperature data to the memory controller 226 and/or host controller 206. In one example, temperature data can be obtained using one or more temperature sensors 230 located throughout the UFS device 222, including temperature sensors located in and around the memory 228 itself (e.g., located on a die containing the memory 228). That is the memory controller 226 provides temperature information to the host controller 206. In another example, temperature data can be obtained using one or more temperature sensors 230 located outside of the memory 228 (e.g., a temperature sensor 230 located in the memory controller 226) and/or external to the UFS device 222 (e.g., on the host controller 206). In one such example, the temperature sensors) 230 provide temperature data to the host controller 206 directly.

In some embodiments, the host controller 206 is configured to receive an I/O operation from the processing system 204 of the SoC 202, and serve a request to the memory controller 226 to perform the I/O operation. The request may include an assignment of a number of lanes and a particular gear by which the memory controller 226 should transmit data to the host controller 206. For example, the UFS device 222 may support four gears (e.g., HS-G1, HS-G2, HS-G3, and HS-G4) over two lanes. Generally, the host controller 206 assigns a specific gear and number of lanes based on the type of I/O operation. In one example, the host controller 206 assigns specific gears and number of lanes according to the type of data in the I/O operation. For example, the host controller 206 can assign HS-G4 for large data transfers and/or high priority requests, HS-G3/HS-G2 for moderate data transfers, and HS-G1 for small data transfers.

In certain aspects, the host controller 206 assigns specific gears and number of lanes to the memory controller 226 according to the temperature of the UFS device 222. For example, the host controller 206 scales the gears based on the temperature provided by the temperature sensor 230.

Figure 3:
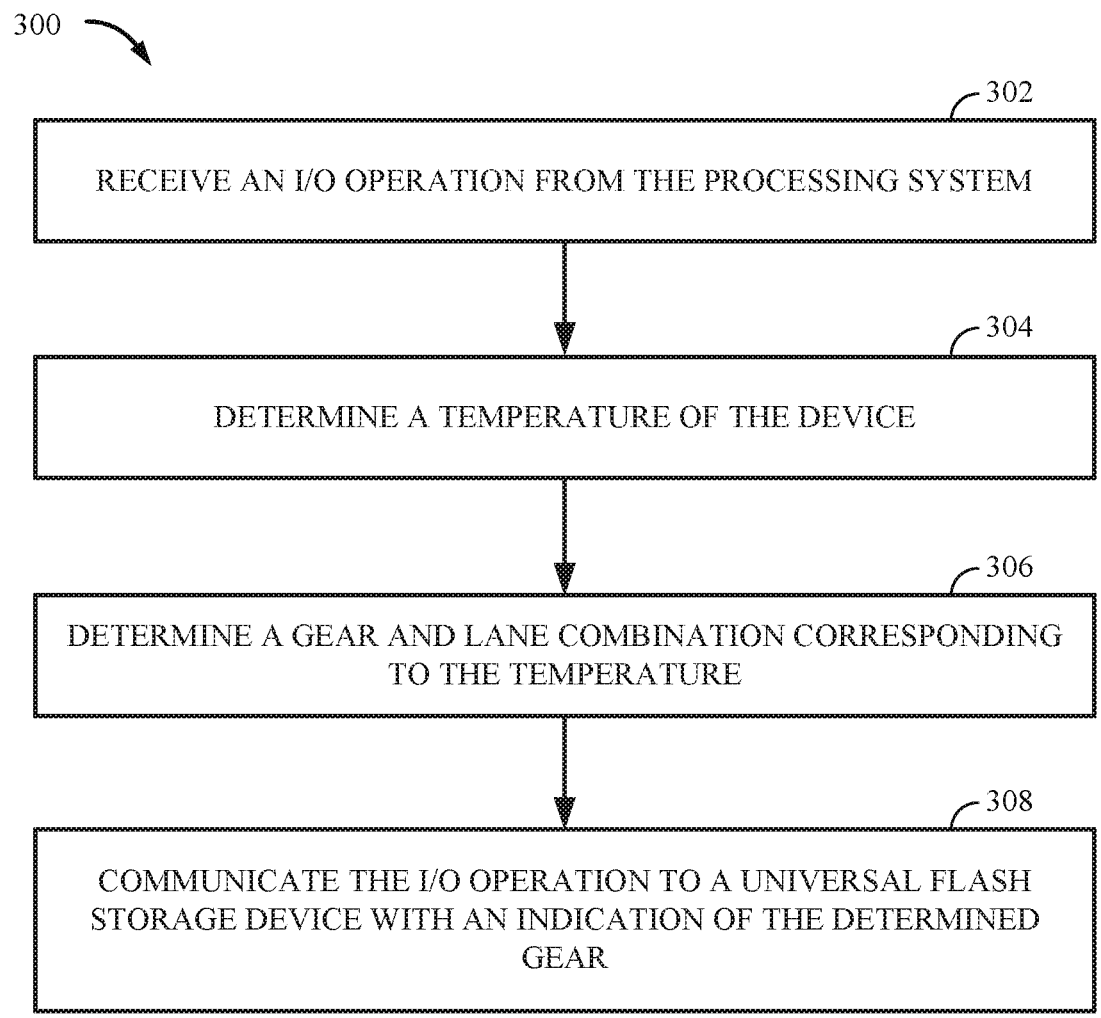
FIG. 3 is a flow chart illustrating an exemplary default process for shifting gears of a UFS device based on the temperature of the UFS device.

FIG. 3 is a flow chart illustrating a default process 300 for shifting gears of the memory controller 226 based on the temperature of the UFS device 222. As described below, some or all illustrated features may be omitted in a particular implementation within the scope of the present disclosure, and some illustrated features may not be required for implementation of all embodiments. In some examples, the default process 300 may be carried out by the SoC illustrated in FIGS. 1 and/or 2. In some examples, the default process 300 may be carried out by any suitable apparatus or means for carrying out the functions or algorithm described below.

At block 302, the host controller 206 receives an I/O operation from the processing system 204. At block 304, the host controller 206 determines a temperature of the UFS device 222. In one example, the host controller 206 receives real-time, periodic temperature readings from the memory controller 226. In another example, the host controller 206 may request a temperature reading aperiodically from the memory controller 226 whenever an I/O operation is received.

At block 306, the host controller 206 determines a gear and lane combination corresponding to the temperature. In one embodiment, the host controller 206 determines a gear and lane combination for a given temperature by utilizing a look-up table containing a range of temperatures with a corresponding gear and lane combination for each temperature. The look-up table may be stored on an internal memory device 208 of the host controller 206, or on another memory device on the SoC 202 external to the host controller 206 (e.g., memory module 116).

At block 308, the host controller 206 communicates the I/O operation to the UFS device 222 with an indication of the determined gear the UFS device 222 should use for performing the I/O operation.

In some embodiments, the UFS device 222 may be configured to operate in an extended temperature range (e.g., between −40° C. and 105° C.). In such an embodiment, the default process 300 may not always result in the best data reliability from the memory controller 226 at relatively extreme temperatures (e.g., −40° C. and 105° C.). Extreme temperatures are known to adversely affect the operation of flash memory devices, and can result in a negative reliability impact on both read and write operations. As used herein, data reliability relates to how consistently data is successfully received by the intended destination without errors.

In order to address the problem of a temperature induced reliability impact, the host controller 206 may utilize an optimal gear and/or lane shifting process to determine which gear and/or lane is best suited for a given temperature of the UFS device 222. This technique, as described in more detail below, greatly reduces the reliability impact of extreme temperatures, and improves performance of the memory system 200.

Figure 4:
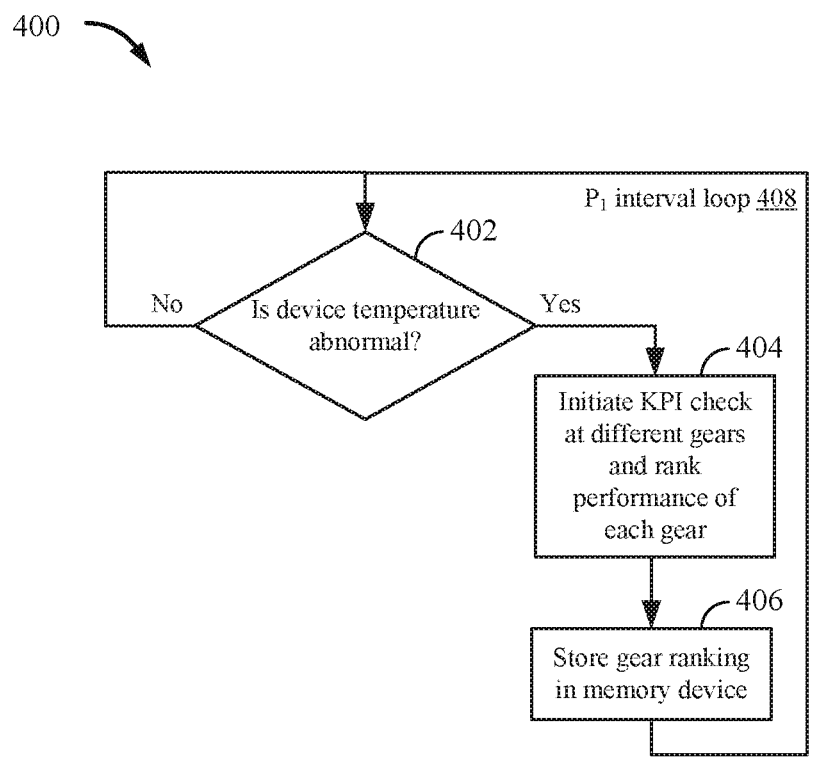
FIG. 4 is a flow chart illustrating an exemplary process for ranking gears used by a UFS device in accordance with certain aspects of the present disclosure.

FIG. 4 is a flow chart illustrating an exemplary process for ranking gears used by a UFS device in accordance with certain aspects of the present disclosure. As described below, some or all illustrated features may be omitted in a particular implementation within the scope of the present disclosure, and some illustrated features may not be required for implementation of all embodiments. In some examples, the process 400 may be carried out by the SoC in FIGS. 1 and/or 2. In some examples, the process 400 may be carried out by any suitable apparatus or means for carrying out the functions or algorithm described below.

At a first block 402, the host controller 206 determines whether a temperature of the UFS device 222 is abnormal. The host controller 206 may determine that a temperature of the UFS device 222 is abnormal if the temperature is within a particular range of temperatures, in one example, the range of temperatures indicative of an abnormal temperature include a low temperature range of −40° C. to −25° C. and a high temperature range of 85° C. to 105° C. If the host controller 206 determines that the temperature of the UPS device 222 is not within an abnormal temperature range, then the host controller 206 waits until receipt of the next temperature reading and repeats the first block 402.

If the host controller 206 determines that the temperature of the UFS device 222 is abnormal, then the process 400 begins execution of an interval loop 408. In some configurations, the interval loop 408 is configured to be executed periodically at defined intervals of time ($P_1$) while the temperature readings of the UFS device 222 are within an abnormal temperature range. In some configurations, the interval loop 408 may be executed aperiodically (e.g., not according to a defined interval). In such a configuration, the interval loop 408 may be executed by the host controller 206 upon receipt of an I/O operation from the processing system 204.

In one embodiment, $P_1$ is an exponential, periodic internal based in part on a hardware characteristic of the UFS device 222. Such an exponential interval may be expressed by equation 1:

$$P_1 = 2^{\alpha x} \quad \text{Equation 1}$$

Where $P_1$ is the interval of time at which the interval loop 408 is executed, x is a variable integer corresponding to an iteration of execution of interval loop 408 (e.g., the first iteration x=0, the second iteration x=1, etc.), and a is the hardware characteristic of the UFS device 222. In one example, $\alpha$ is an integer that corresponds to a quality of the hardware of the UFS device 222 (e.g., a temperature range that one or more components of the memory controller 226 are designed to tolerate, a clock rate of the memory controller 226, read, write, and erase timing characteristics of the UFS device 222, etc.). In other examples, a is an integer that corresponds to hardware characteristics of the SoC 202, such as bus bandwidth availability Accordingly, the interval loop 408 is repeated at interval $P_1$ while the UFS device 222 is indicating a temperature that falls within an abnormal temperature range. The process 400 then advances to block 404 where the host controller 206 initiates a key performance indicator (KPI) check to determine a performance ranking of each gear and lane combination at the abnormal temperature.

KPIs include one or more of the measures and/or operating parameters that indicate or are representative of a level of performance of a particular portion or layer of hardware, software, and/or firmware supporting functionality of the UFS device 222, or more particularly, the memory 228. In some configurations, a KPI of the UFS device 222 relates to data reliability, or the consistency by which data provided by the UFS device 222 is successfully received by the intended destination without errors. KPI checks relate to techniques (e.g., mock and/or actual I/O operations) for determining the level of performance or behavior of various portions or layers (e.g., memory 228) of the UFS device 222 during operation of the device. In some configurations, host controller 206 may perform KPI checks on the UFS device 222 in order to identify a problem in the execution of I/O operations while the UFS device 222 is within an abnormal range of temperatures.

In one embodiment, the host controller 206 initiates the KPI check by transmitting a mock I/O operation to the UFS device 222 to profile data reliability of the UFS device 222 at each gear and lane combination. The mock I/O operation may include at least one write operation and one read operation for each gear and lane combination. Iii one example, the mock I/O operation includes a command for the memory controller 226 to write data into the memory 228, then read the data, and provide the read data back to the host controller 206 utilizing a gear and lane combination assigned to the operation. Accordingly, the host controller 206 can compare the data read it received from the memory controller 226 during execution of the mock I/O operation, and compare the read data to the data in the write data command to determine a number of data errors received by the host controller 206.

In one embodiment, the host controller 206 initiates the KPI, check utilizing the current working gear of the UFS device 222. For example, if the UFS device 222 is already operating in the highest gear (e.g., HS-G4), then the host controller 206 first transmits a mock I/O operation to UFS device 222 to be performed in the highest gear. Initially, a mock I/O operation is communicated for each possible combination of the highest gear with the number of lanes (e.g., a mock I/O operation to be performed using HS-G4 and one lane, and another mock I/O operation to be performed using HS-G4 and two lanes). The host controller 206 then transmits an additional mock I/O operation for each of the remaining gear and lane combinations, in a descending order of gears (e.g., HS-G3, HS-G2, and HS-G1).

In another example, if the UFS device 222 is already operating in the lowest gear (e.g., HS-G1), then the host controller 206 first transmits a mock I/O operation to UFS device 222 to be performed in the lowest gear. Initially, a mock I/O operation is communicated for each possible combination of the lowest gear with the number of lanes (e.g., a mock I/O operation to be performed using HS-G1 and one lane, and another mock I/O operation to be performed using HS-G1 and two lanes). The host controller 206 then transmits an additional mock I/O operation for each of the remaining gear and lane combinations, in an ascending order of gears (e.g., HS-G2, HS-G3, and HS-G4).

In another example, if the UFS device 222 is already operating in a moderate gear (e.g., HS-G2/3), then the host controller 206 first transmits a mock I/O operation to UFS device 222 to be performed in the moderate gear. Initially, a mock I/O operation is communicated for each possible combination of the moderate gear with the number of lanes (e.g., a mock I/O operation to be performed using HS-G2/3 and one lane, and another mock I/O operation to be performed using HS-G2/3 and two lanes). The host controller 206 then transmits an additional mock I/O operation for each of the remaining gear and lane combinations, in an ascending order of gears (e.g., HS-G3, HS-G4) before transmitting mock I/O operations for HS-G1.

The host controller 206 then ranks the gear and lane combinations at the determined abnormal temperature based on a performance metric of the UFS device 222. In one example, the ranking is based on data reliability (e.g., a number of data errors received by the host controller 206) during the execution of each mock I/O operation. In another example, the ranking is based on an actual data rate (e.g., bits-per-second) associated with one or more of the amount of time required for the memory controller 226 to write the data of the mock I/O operation, or the amount of time required for the memory controller 226 to read the data of the mock I/O operation to the host controller 206. In some embodiments, the host controller 206 also accounts for power consumption of the UFS device 222 when ranking the gears. For example, the host controller 206 may rank the gears based on which gear is most reliable while operating using optimal power consumption at a given data rate (e.g., 2 W while providing 1 Gbps data rate).

At block 406 the host controller 206 stores the ranking of the gear and lane combinations associated with the abnormal temperature determined at block 402. Here, the host controller 206 stores the ranking of the gear and lane combinations on the internal memory device 208, or on another memory device on the SoC 202 external to the host controller 206 (e.g., memory module 116). The ranking may be stored as an index or lookup table configured to correlate the rankings with the abnormal temperature. In some embodiments, only the highest ranking gear and lane combination is stored.

Figure 5:
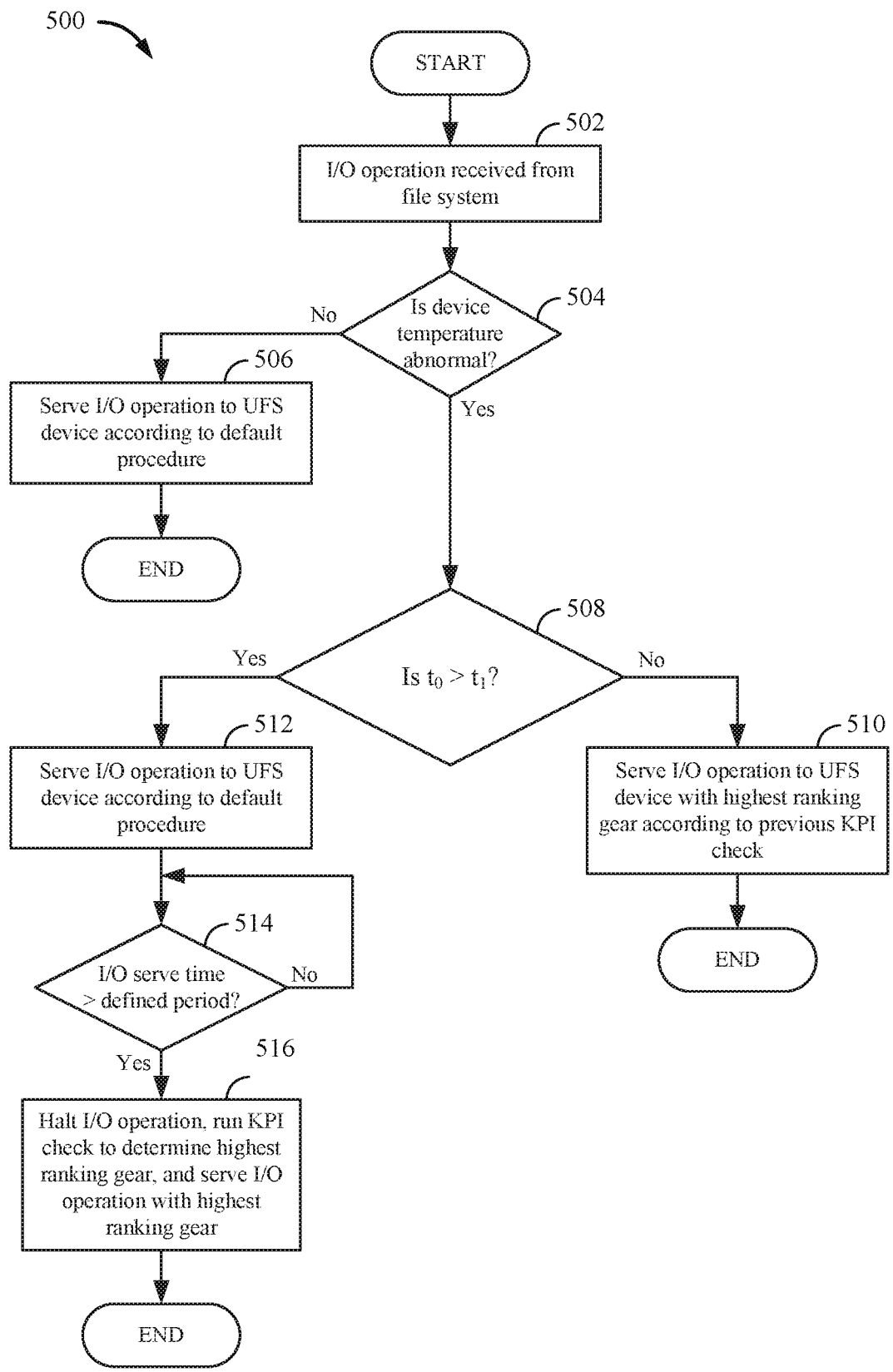
FIG. 5 is a flow chart illustrating an exemplary process for shifting gears according to gear rank during certain temperatures in accordance with certain aspects of the present disclosure.

FIG. 5 is a flow chart illustrating an exemplary process 500 for shifting gears according to gear rank during certain temperatures in accordance with certain aspects of the present disclosure. As described below, some or all illustrated features may be omitted in a particular implementation within the scope of the present disclosure, and some illustrated features may not be required for implementation of all embodiments. In some examples, the optimized process 500 may be carried out by the SoC in FIGS. 1 and/or 2. In some examples, the optimized process 500 may be carried out by any suitable apparatus or means for carrying out the functions or algorithm described below.

Al block 502, the host controller 206 receives a request to perform a memory I/O operation. For example, the I/O operation may include a read operation and a write operation targeted to the memory 228 of the UFS device 222. Accordingly, the I/O operation may be configured to identify the memory 228 and one or more storage locations in the memory 228 for reading and/or writing data.

At block 504, the host controller 206 determines a temperature of the UFS device 222, and whether that temperature is within an abnormal range of temperatures. If the temperature is not within an abnormal range, then the host controller 206 moves on to block 506 where the host controller serves the I/O operation to the UFS device 222 according to the default procedure described in relation to FIG. 3. For example, the host controller 206 determines a gear and lane combination corresponding to the determined temperature, and communicates the I/O operation to the memory controller 226 with an indication of the gear and lane combination. Alternatively, if the temperature is within the abnormal range, then the host controller 206 moves on to block 508.

At block 508, the host controller 206 determines if a previously stored gear ranking is expired. In some configurations, the host controller 206 compares an amount of time between the last KPI check and a current time ($t_0$), to a current interval time ($t_1$) to determine whether a threshold condition is satisfied. In one example, the threshold condition is satisfied if $t_0$ is greater than $t_1$, at which point the process 500 moves on to block 512. Note that if the threshold condition is not satisfied, the process moves on to block 510, whereby the host controller 206 serves the I/O operation to the memory controller 226 with an assignment for the memory controller to execute the I/O operation utilizing the highest ranking gear and lane combination previously determined by a KPI check. Accordingly, the I/O operation is served to the memory controller 226 with a command for the memory controller to utilize the best performing gear and lane combination for the current temperature, thereby reducing the reliability impact of extreme temperatures and improving performance of the memory system 200.

Referring still to block 508, in certain embodiments, the host controller 206 calculates $t_1$ according to an algorithm. For example, $t_1$ may be calculated by determining a length of a current interval between a previous KPI check and a next KPI check (e.g., the length of current $P_1$ duration), and dividing the length of the current duration by a preset integer stored on the host controller 206. That is, if the preset integer is two, then the host controller 206 calculates $t_1$ by dividing the length of the current duration by two.

In one embodiment, the host controller 206 determines that the threshold condition is satisfied when $t_0$ is greater than $t_1$. In one example scenario, the interval loop 408 is defined by $P_1=2^{4x}$, meaning that a first iteration of the interval loop 408 (i.e., x=0) occurs when the host controller 206 receives an abnormal temperature reading from the FITS device 222. The second iteration occurs 16 minutes later, followed by a third iteration 32 minutes later, etc. In this example scenario, the host controller 206 receives the I/O operation 31 minutes after the second iteration of the interval loop 408 (i.e., one minute prior to the third iteration at 32 minutes). Here, the host controller 206 determines that the current interval time between KPI checks (i.e., duration between the second iteration and the third iteration) is 16 minutes. Host controller 206 then divides the 16 minutes by the preset integer (in this case the preset integer equals 2) to determine that $t_1=8$ minutes. The host controller 206 also determines that $t_0=15$ (i.e., the amount of time between the last KPI check (16 minutes) and a current time (31 minutes)). The host controller 206 then determines that $t_0$ is greater than $t_1$, and the process 500 moves on to block 512.

At block 512, the host controller 206 serves the I/O operation to memory controller 226 according to one or more of the steps described in the default procedure illustrated in FIG. 3. For example, the host controller 206 may determine a gear and lane combination for the I/O operation by utilizing a stored look-up table containing a range of temperatures with a corresponding gear and lane combination for each temperature, and serve the I/O operation to the memory controller 226 with an indication of the determined gear and lane combination that corresponds to the current temperature of the UFS device 222.

In some configurations, the host controller 206 may monitor the amount of time that the UFS device 222 is taking to execute the I/O operation. For example, at block 514, the host controller 206 determines whether the amount of time required by the UFS device 222 to execute the I/O operation is greater that a predefined duration of time. In some examples, the predefined duration of time may be based on the amount of data involved in the I/O operation. In one example, the host controller includes a look-up table that provides predefined durations of time that correspond to a plurality of data sizes associated with an I/O operation.

If the host controller 206 determines that the UFS device 222 has taken too much time to execute the I/O operation (as defined by whether the amount of time taken by the UFS device 222 is greater that the predefined duration of time), then the process 500 moves on to block 516.

At block 516, the host controller 206 halts the I/O operation served to the UFS device at block 512, and initiates a KM check to determine a highest ranking gear and lane combination at the current temperature. For example, the host controller 206 may execute the processes described above illustrated in blocks 404 and 406 of FIG. 4. Upon completion of the KPI check and determination of the highest ranking gear and lane combination, the host controller re-serves the I/O operation to the memory controller 226 with an indication that the UFS device 222 utilize the highest ranking gear and lane combination when it executes the I/O operation. Accordingly, the I/O operation is served to the memory controller 226 with a command for the memory controller to utilize the best performing gear and lane combination for the current temperature, thereby reducing the reliability impact of extreme temperatures and improving performance of the memory system 200.

Figure 6:
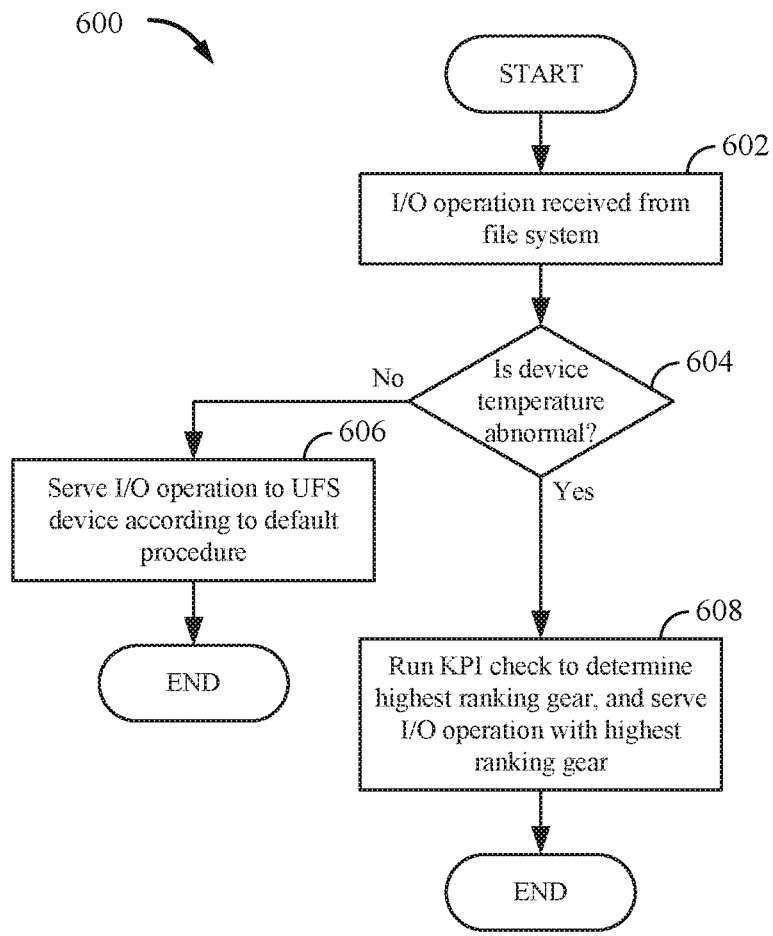
FIG. 6 is a flow chart illustrating another exemplary process for shifting gears according to gear rank during certain temperatures in accordance with certain aspects of the present disclosure.

FIG. 6 is a flow chart illustrating an optimized process 600 for ranking gears used by a UPS device in accordance with certain aspects of the present disclosure. As described below, some or all illustrated features may be omitted in a particular implementation within the scope of the present disclosure, and some illustrated features may not be required for implementation of all embodiments. In some examples, the optimized process 600 may be carried out by the SoC in FIGS. 1 and/or 2. In some examples, the optimized process 600 may be carried out by any suitable apparatus or means for carrying out the functions or algorithm described below.

At block 602, the host controller 206 receives a request to perform a memo I/O operation.

At block 604, the host controller 206 determines a temperature of the UFS device 222, and whether that temperature is within an abnormal range of temperatures. If the temperature is not within an abnormal range, then the host controller 206 moves on to block 606 where the host controller serves the I/O operation to the UFS device 222 according to the default procedure described in relation to FIG. 3. For example, the host controller 206 determines a gear and lane combination corresponding to the determined temperature, and communicate the I/O operation to the memory controller 226 with an indication of the gear and lane. Alternatively, if the temperature is within the abnormal range, then the host controller 206 moves on to block 608.

At block 608, the host controller 206 initiates a KPI check to determine a highest ranking gear and lane combination at the current temperature. For example, the host controller 206 may execute the processes described above illustrated in blocks 404 and 406 of FIG. 4. Upon completion of the KPI check and determination of the highest ranking gear and lane combination, the host controller serves the I/O operation to the memory controller 226 with an indication to utilize the highest ranking gear and lane combination when executing the I/O operation. Accordingly, the I/O operation is served to the memory controller 226 with a command for the memory controller to utilize the best performing gear and lane combination for the current temperature, thereby reducing the reliability impact of extreme temperatures and improving performance of the memory system 200.

In some configurations, the term(s) 'communicate,' 'communicating,' and/or 'communication' may refer to 'receive,' 'receiving,' and/or other related or suitable aspects without necessarily deviating from the scope of the present disclosure. In some configurations, the term(s) 'communicate,' 'communicating,' 'communication,' may refer to 'transmit,' 'transmitting,' 'transmission,' and/or other related or suitable aspects without necessarily deviating from the scope of the present disclosure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features and/or functions illustrated herein may be rearranged and/or combined into a single component, step, feature or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for" or simply as a "block" illustrated in a figure.

These apparatus and methods described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, firmware, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or combinations thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, PCM (phase change memory), flash memory, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

What is claimed is:

1. A method for managing data communication rates of a memory device, the method comprising:
   executing a first memory test configured to determine performance of the memory device at a detected temperature and at each data rate of a plurality of data rates, wherein each of the plurality of data rates are used by the memory device for performing I/O operations;

determining a first rank of one or more of the plurality of data rates based on memory device performance of the first memory test;
receiving an input/output (I/O) operation to be executed by the memory device;
detecting the temperature of the memory device;
determining whether the detected temperature satisfies a threshold condition, wherein the threshold condition is satisfied if the detected temperature is above a first temperature threshold or below a second temperature threshold;
if the threshold condition is satisfied, selecting a data rate from the plurality of data rates based on the first rank; and
serving, to the memory device, the I/O operation with an indication to execute the I/O operation using the selected data rate.

2. The method of claim 1, wherein each data rate of the plurality of data rates further corresponds to one or more high-speed serial interfaces used by the memory device for communicating at the respective one of the plurality of data rates.

3. The method of claim 1, wherein executing the first memory test further comprises:
serving a plurality of mock I/O operations to the memory device, wherein each of the plurality of mock I/O operations are configured to be executed by the memory device based on the detected temperature according to each of the plurality of data rates; and
determining data reliability of each data rate based on the execution of the plurality of mock I/O operations by the memory device.

4. The method of claim 3, wherein determining data reliability of each data rate comprises determining an error rate of data returned by the memory device during the execution of the plurality of mock I/O operations, and wherein determining the first rank of one or more of the plurality of data rates comprises ranking each of the plurality of data rates as a hierarchical ranking according to data reliability of the memory device at each data rate.

5. The method of claim 1, further comprising storing, on an internal memory, the first ranking of the one or more of the plurality of data rates according to the detected temperature, wherein the internal memory further comprises a predetermined index indicating a correspondence between each data rate of the plurality of data rates and a temperature, and wherein the predetermined index is not determined by a memory test.

6. The method of claim 5, further comprising:
if the threshold condition is satisfied, periodically executing a memory test according to an interval of time; and
if the I/O operation is received after execution of the first memory test and before a second memory test configured to be executed according to the periodic interval of time, determining if the first ranking of the one or more of the plurality of data rates based on the first memory test is expired.

7. The method of claim 6, wherein if the first ranking is expired:
selecting a data rate from the predetermined index corresponding to the detected temperature; and
serving the I/O operation to the memory device with a request to perform the I/O operation using the data rate selected from the predetermined index.

8. The method of claim 7, further comprising:
determining whether an amount of time used by the memory device while executing the served I/O operation using the data rate selected from the predetermined index is greater than a predefined length of time;
if the amount of time is greater than the predefined length of time:
halting the served I/O operation;
executing a second memory test to determine performance of the memory device at each data rate of a plurality of data rates at the detected temperature;
determining a second ranking of one or more of the plurality of data rates based on the memory device performance of the second memory test;
selecting a data rate from the plurality of data rates based on the second ranking; and
re-serving, to the memory device, the I/O operation with an indication to execute the I/O operation using the selected data rate based on the second ranking.

9. The method of claim 6, wherein if the first ranking is not expired, serving, to the memory device, the I/O operation with an indication to execute the I/O operation using the selected data rate based on the first ranking.

10. The method of claim 6, wherein determining if the first ranking is expired comprises:
determining an amount of time elapsed between a current time and execution of the first memory test; and
comparing the amount of time elapsed to a threshold value, wherein the first ranking is expired if the amount of time is greater than the threshold value.

11. A memory controller configured for managing data communication rates of a memory device, comprising:
a digital memory; and
a processor communicatively coupled to the memory, wherein the processor is configured to:
execute a first memory test configured to determine performance of the memory device at a detected temperature and at each data rate of a plurality of data rates, wherein each of the plurality of data rates are used by the memory device for performing I/O operations;
determine a first rank of one or more of the plurality of data rates based on memory device performance of the first memory test;
receive an input/output (I/O) operation to be executed by the memory device;
detect the temperature of the memory device;
determine whether the detected temperature satisfies a threshold condition, wherein the threshold condition is satisfied if the detected temperature is above a first temperature threshold or below a second temperature threshold;
if the threshold condition is satisfied, select a data rate from the plurality of data rates based on the first rank; and
serve, to the memory device, the I/O operation with an indication to execute the I/O operation using the selected data rate.

12. The memory controller of claim 11, wherein each data rate of the plurality of data rates further corresponds to one or more high-speed serial interfaces used by the memory device for communicating at the respective one of the plurality of data rates.

13. The memory controller of claim 11, wherein the processor, being configured to execute the first memory test, is further configured to:
serve a plurality of mock I/O operations to the memory device, wherein each of the plurality of mock I/O operations are configured to be executed by the memory device based on the detected temperature according to each of the plurality of data rates; and determine data reliability of each data rate based on the execution of the plurality of mock I/O operations by the memory device.

14. The memory controller of claim 13, wherein the processor, being configured to determine data reliability of each data rate, is further configured to determine an error rate of data returned by the memory device during the execution of the plurality of mock I/O operations; and wherein the processor, being configured to determine the first rank of one or more of the plurality of data rates, is further configured to rank each of the plurality of data rates as a hierarchical ranking according to data reliability of the memory device at each data rate.

15. The memory controller of claim 11, wherein the processor is further configured to store the first ranking of the one or more of the plurality of data rates according to the detected temperature on the digital memory;

wherein the digital memory comprises a predetermined index indicating a correspondence between each data rate of the plurality of data rates and a temperature; and wherein the predetermined index is not determined by a memory test.

16. The memory controller of claim 15, wherein the processor is further configured to:

periodically execute a memory test according to an interval of time if the threshold condition is satisfied; and determine if the first ranking of the one or more of the plurality of data rates based on the first memory test is expired if the I/O operation is received after execution of the first memory test and before a second memory test configured to be executed according to the periodic interval of time.

17. The memory controller of claim 16, wherein if the first ranking is expired, the processor is further configured to:

select a data rate from the predetermined index corresponding to the detected temperature; and serve the I/O operation to the memory device with a request to perform the I/O operation using the data rate selected from the predetermined index.

18. The memory controller of claim 17, wherein the processor is further configured to:

determine whether an amount of time used by the memory device while executing the served I/O operation using the data rate selected from the predetermined index is greater than a predefined length of time, wherein if the amount of time is greater than the predefined length of time, the processor is further configured to:

halt the served I/O operation;

execute a second memory test to determine performance of the memory device at each data rate of a plurality of data rates at the detected temperature;

determine a second ranking of one or more of the plurality of data rates based on the memory device performance of the second memory test;

select a data rate from the plurality of data rates based on the second ranking; and re-serve, to the memory device, the I/O operation with an indication to execute the I/O operation using the selected data rate based on the second ranking.

19. The memory controller of claim 16, wherein if the first ranking is not expired, the processor is further configure to serve, to the memory device, the I/O operation with an indication to execute the I/O operation using the selected gear data rate based on the first ranking.

20. An apparatus, comprising:

means for executing a first memory test configured to determine performance of a memory device at a detected temperature and at each data rate of a plurality of data rates, wherein each of the plurality of data rates are used by the memory device for performing I/O operations;

means for determining a first rank of one or more of the plurality of data rates based on memory device performance of the first memory test;

means for receiving an input/output (I/O) operation to be executed by the memory device;

means for detecting the temperature of the memory device;

means for determining whether the detected temperature satisfies a threshold condition, wherein the threshold condition is satisfied if the detected temperature is above a first temperature threshold or below a second temperature threshold;

means for selecting a data rate from the plurality of data rates based on the first rank if the threshold condition is satisfied; and means for serving, to the memory device, the I/O operation with an indication to execute the I/O operation using the selected data rate.

* * * * *